(12) United States Patent
Blanchard et al.

(10) Patent No.: US 8,937,502 B2
(45) Date of Patent: Jan. 20, 2015

(54) LATERAL INSULATED GATE TURN-OFF DEVICES

(71) Applicant: Pakal Technologies, LLC, San Francisco, CA (US)

(72) Inventors: Richard A. Blanchard, Los Altos, CA (US); Hidenori Akiyama, Miyagi (JP); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 0 days.

(21) Appl. No.: 14/191,937

(22) Filed: Feb. 27, 2014

(65) Prior Publication Data

US 2014/0240025 A1    Aug. 28, 2014

Related U.S. Application Data

(60) Provisional application No. 61/770,072, filed on Feb. 27, 2013.

(51) Int. Cl.
*H03K 17/04* (2006.01)
*H01L 29/745* (2006.01)
*H01L 29/739* (2006.01)

(52) U.S. Cl.
CPC ........ *H01L 29/7455* (2013.01); *H01L 29/7395* (2013.01); *H03K 17/0403* (2013.01)
USPC .......................................................... 327/376

(58) Field of Classification Search
CPC . H03K 17/04123; H03K 17/725; F02P 3/053; F02P 3/0453; F02D 41/1402
USPC ......................................................... 327/376
See application file for complete search history.

(56) References Cited

U.S. PATENT DOCUMENTS

| | | | | |
|---|---|---|---|---|
| 8,803,191 B2 * | 8/2014 | Blanchard | ...................... | 257/141 |
| 2007/0235804 A1 * | 10/2007 | Watanabe et al. | ............. | 257/347 |
| 2013/0175576 A1 * | 7/2013 | Blanchard | ...................... | 257/141 |
| 2014/0240025 A1 * | 8/2014 | Blanchard et al. | ............ | 327/376 |
| 2014/0240027 A1 * | 8/2014 | Blanchard et al. | ............ | 327/382 |

* cited by examiner

*Primary Examiner* — Adam Houston
(74) *Attorney, Agent, or Firm* — Patent Law Group LLP; Brian D. Ogonowsky

(57) ABSTRACT

A lateral insulated gate turn-off (IGTO) device includes an n-type layer, a p-well formed in the n-type layer, a shallow n+ type region formed in the well, a shallow p+ type region formed in the well, a cathode electrode shorting the n+ type region to the p+ type region, at least one trenched gate extending through the n+ type region and into the well, a p+ type anode region laterally spaced from the well, and an anode electrode electrically contacting the p+ type anode region. The structure forms a lateral structure of NPN and PNP transistors, where the well forms the base of the NPN transistor. When a turn-on voltage is applied to the gate, the p-base has a reduced width, resulting in the beta of the NPN transistor increasing beyond a threshold to turn on the IGTO device by current feedback.

20 Claims, 6 Drawing Sheets

LATERAL INSULATED GATE TURN-OFF DEVICES

CROSS-REFERENCE TO RELATED APPLICATIONS

This application is based on provisional application Ser. No. 61/770,072, filed Feb. 27, 2013, by Richard Blanchard et al., assigned to the present assignee and incorporated herein by reference.

FIELD OF THE INVENTION

This invention relates to insulated gate turn-off (IGTOs) devices and, more particularly, to a lateral IGTO with trenched gates.

BACKGROUND

It is known to provide trenched gates for turning on and off switching devices. U.S. Pat. No. 7,705,368, incorporated herein by reference, describes a vertical insulated gate turn-off (IGTO) thyristor having a vertical NPNP semiconductor layered structure. This forms vertical NPN and PNP bipolar transistors. A cathode electrode is formed on the top n-type layer, and an anode electrode is formed on the bottom p-type layer. The trenched gates extend a certain depth into the upper p-type layer base of the NPN transistor. When a forward bias voltage is applied between the cathode and anode of the device, applying a positive voltage to the gates inverts a portion of the p-type layer base to reduce the base width and increase the beta of the NPN transistor. At this point, the product of the betas of the NPN and PNP transistors is greater than one. The initially small diffusion current is then rapidly amplified by feedback, causing "breakover," where both the NPN and PNP transistors become fully conducting. To turn off the device, the gate voltage is removed to increase the base width, so the product of the betas is less than one.

Such vertical IGTO devices are more efficient than insulated gate bipolar transistors (IGBTs) and can conduct higher currents due to having a higher current density when on.

One problem with such a vertical IGTO device is that the distance between the bottom of the trenched gate and the bottom of the p-type layer directly affects the turn-on voltage. It is very difficult to precisely control the depths of the trenches, so the turn-on voltage varies from lot to lot. Further, the p-type layer must be fairly deep, and therefore the doping will typically be in-situ doping while the p-type layer is formed. The turn-on voltage is also affected by the doping of the p-type layer. It would be difficult to create a uniformly doped, deep p-type layer using implantation. Further, forming deep trenches for a high voltage device is very time-consuming and therefore expensive. Still further, it is difficult to form other circuitry on the same die as the vertical IGTO device since the IGTO device requires a topside cathode and a bottomside anode.

What is needed is an improvement of the IGTO device that does not suffer from the above-mentioned drawbacks.

SUMMARY

Various types of lateral IGTO devices are disclosed.

The term "thyristor" is not used to describe the IGTO device, since the term "thyristor" is conventionally used to describe a structure that latches in its on state and can only be turned off by lowering the current below a threshold level, such as by reversing the current in an AC application. In contrast, the present device can be turned on and off by gate control, making the device far more useful than a traditional thyristor. The turn-off may be by shorting the gate to the cathode electrode.

In one embodiment, an n-type layer, such as an n-type substrate or an n-type layer grown over a substrate, has formed in it a relatively shallow p-well by dopant implantation. Such a p-well can be formed with precisely defined outer boundaries since a mask is used. The depth of the p-well is not critical since the device conducts current laterally rather than vertically.

Trenches are etched into the p-well that do not extend completely through the p-well. The walls of the trenches are insulated such as by a thin thermal oxide layer. The trenches are then filled with a conductive gate material, such as doped polysilicon. The edge of the trenched gate can be precisely positioned relative to the edge of the p-well by aligning the respective masks.

A shallow n+ type region is formed by implantation in the p-well and intersects the opposite edge of the trenched gate, so that an upper portion of the gate is within the n+ type region, the remaining upper portion of the gate is within the p-well, and the entire bottom portion of the gate is within the p-well. The n+ type region is shorted to the p-well with a cathode electrode, and the gate is connected to a gate electrode.

A p+ type region (an anode region) is formed by implantation in the n-type layer and spaced away from the p-well. An anode electrode is formed over the p+ type region.

The lateral NPNP structure forms lateral NPN and PNP transistors, where the p-well acts as a base for the NPN transistor, and the lateral distance between the shallow n+ type region and the edge of the p-well facing the p+ type region (the emitter for the PNP transistor) defines the width of the base in the off state when the gate is shorted to the cathode.

During operation, a forward bias voltage is applied between the anode and cathode electrodes. In the off state, the wide base of the NPN transistor results in the product of the betas of the NPN and PNP transistors being less than one, so there is no current feedback and the device blocks current flow. The junction of the p-well and the n-type layer is reverse biased.

When the gate voltage is increased above the turn-on threshold voltage (e.g., 2-5 volts), electrons are drawn to the gate from the n+ type region, and the p-well surrounding the gate becomes inverted and acts as an extension of the n+ type region. This effectively narrows the NPN transistor base width and increases the beta of the NPN transistor. At this point, the product of the betas of the NPN and PNP transistors is greater than one. Diffusion current is amplified, and the feedback current eventually causes "breakover," where the resulting injection of carriers into the n-type layer and p-well fully turns on the NPN and PNP transistors to conduct current between the anode and cathode electrodes with a voltage drop of about 1.4 volts.

As seen, the NPN base width can be precisely controlled by masking so that the turn-on voltage can be made very predictable from lot to lot. Additionally, since the lateral distance between the p+ type anode region and the p-well determines the breakdown voltage, rather than the depth of the p-well for a vertical device, the gate trenches do not have to be deep and can be formed relatively quickly. Still further, since the anode and cathode electrodes are on the top of the die, other circuitry can be easily formed in the die. The n-type layer may be a well or tub in a p-type substrate and can be electrically insulated from other portions of the substrate by sinkers or trenches.

In another embodiment, a plurality of trenched gates is formed in the p-well, as described above, but a subset of the gates extends past the p-well boundary. The gates that extend through the p-well form part of an insulate gate bipolar transistor (IGBT) with a well-defined turn-on voltage. The portion of the p-well along the IGBT gate acts as an n-channel when inverted by a sufficiently positive gate voltage to conduct current between the shallow n+ type region and the p+ type anode region. This current flow increases the beta of the PNP transistor by overcoming the recombination losses and accelerates the turn-on of the IGTO portion of the device. Such a device is a hybrid IGTO/IGBT device.

The IGBT gate for the hybrid device may either extend laterally through the p-well to create a lateral channel or extend vertically through the p-well to create a vertical channel between the n+ type region and the n-type layer.

A bi-directional IGTO or hybrid device may be made by forming a mirror image of the p-well, trenched gates, and n+ type region, with the n− type layer laterally separating the two portions.

A bypass diode may be formed to conduct current when the IGTO is reverse biased. The bypass diode is formed by implanting one or more n+ type regions abutting the p+ type anode region and shorting the regions by the anode electrode. Thus, a reverse voltage applied to the anode and cathode electrodes will be conducted by the forward biased bypass diode through the n-type layer and the p-well.

The widths of the n+ type regions, p-well, and p+ type anode regions and the number of gates may be selected based on the specified maximum current for the device. Alternately, cells of the IGTO device may be repeated in an array and connected in parallel. For a high current device, the die may be 1 cm per side. Other circuitry may be formed in the die, such as control circuitry for the IGTO switch.

Other embodiments are described.

BRIEF DESCRIPTION OF THE DRAWINGS

Elements that are similar or identical in the various figures are labeled with the same numeral.

DETAILED DESCRIPTION

Figure 1:
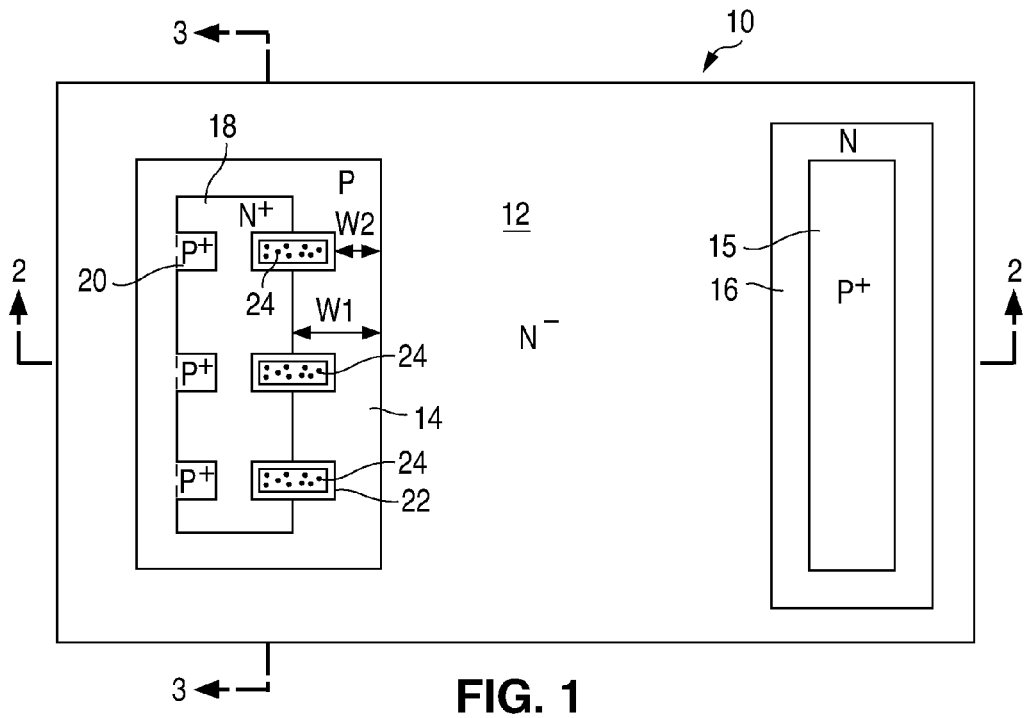
FIG. 1 is a top down view of an IGTO device in accordance with one embodiment of the present invention. The sizes of the various semiconductor regions and the number of gates, or the number of identical cells in parallel, may be selected for the maximum current to be conducted.
Figure 2:
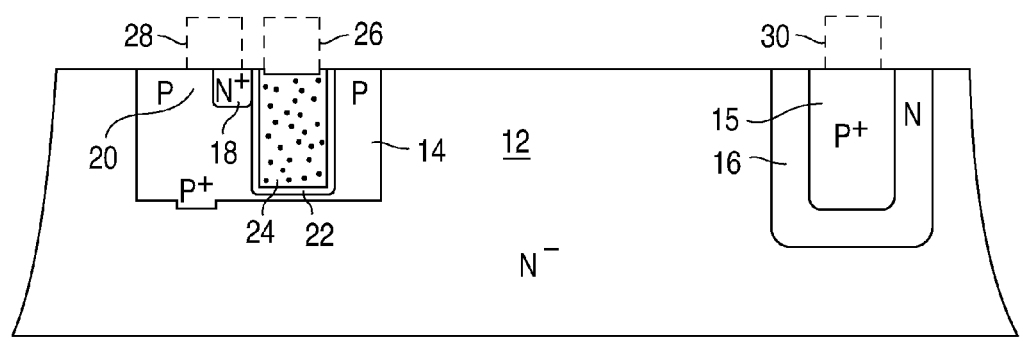
FIG. 2 is a cross-sectional view along line 2-2 in FIG. 1.
Figure 3:
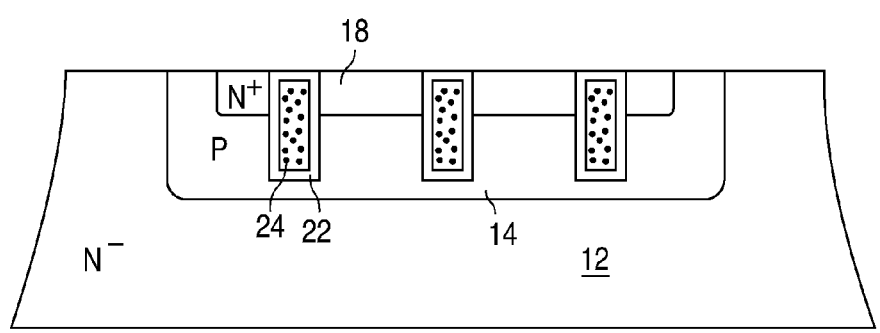
FIG. 3 is a cross-sectional view along line 3-3 in FIG. 1.

FIG. 1 is a simplified top down view of an IGTO device 10 in accordance with one embodiment of the invention. The device 10 may be a 3-terminal silicon-based die. FIG. 2 is a cross-sectional view along line 2-2 in FIG. 1, and FIG. 3 is a cross-sectional view along line 3-3 in FIG. 1. The sizes of the features and number of gates will depend on the desired breakdown voltage and maximum current to be conducted.

The starting substrate will typically be silicon. In the examples, the various features are formed in an n-type layer 12. This n-type layer 12 may be the actual substrate or a doped epitaxial layer on the substrate. The n-type layer 12 may even be formed over an insulating layer. The selection of the n-type layer 12 may depend on whether additional circuitry is to be formed in the die. For example, the n-type layer 12 may be electrically isolated from other circuitry formed in the same die by surrounding the n-type layer with a p+ type sinker extending to a p-type substrate, or surrounding the n-type layer 12 with a trench extending to the p-type substrate. Alternatively, the n-type layer 12 may be a doped n-well in a p-type substrate.

If the n-type layer 12 is grown over a p-type substrate, the n-type layer 12 has a preferred thickness greater than 10 microns. Its doping concentration is between about $5\times10^{13}$ to $5\times10^{14}$ cm$^{-3}$. This dopant concentration can be obtained by in-situ doping during epitaxial growth.

A p-type well 14 (hereinafter a p-well) is defined by a mask and formed by implanting dopants. The peak doping in the p-well 14 can be, for example, $10^{16}$-$10^{18}$ cm$^{-3}$. The depth of the p-well 14 will typically be between 0.1-10 microns. The p− well 14 is wholly contained in the n-type layer 12.

Simultaneously with forming the p-well 14, a p-type anode region 15 is formed. The spacing between the p-well 14 and the p-type anode region 15 depends on the desired breakdown voltage of the device. Alternatively, the p-type anode region 15 may be formed by a separate implantation step.

An optional n-type buffer well 16 may be implanted prior to the formation of the p-well 14 and p-type anode region 15 and has a dopant concentration between about $10^{17}$ to $5\times10^{17}$ cm$^{-3}$. The n-type buffer well 16 reduces the injection of holes into the n-type layer 12 from the p-type anode region 15 when the device is off, since the n-type buffer well 16 has a dopant concentration higher than that of the n-type layer 12.

Another masked implant is then used to create a shallow n+ type region 18 in the p-well 14. The n+ type region 18 has a depth of, for example, 0.05-1.0 microns. In one embodiment, the n+ type region 18 is formed by an implant of arsenic or phosphorus at an energy of 10-150 keV and an area dose of $5\times10^{13}$ to $10^{16}$ cm$^{-2}$, to create a dopant concentration exceeding $10^{19}$ cm$^{-3}$.

Another masked implant is then used to create distributed p+ type regions 20 along an edge of the n+ type region 18 for the purpose of creating ohmic contact between a metal cathode electrode and the p-well 14. When a sufficient current flows through the p-well 14, the resistance between the right side of the p-well 14 and the p+ type regions 20 near the left side of the p-well 14 causes the differential voltage to exceed 0.6 volts to forward bias the emitter-base of the NPN transistor to turn it on. This implant may also further dope the p-type anode region 15 to make it p+ type so that ohmic contact may be made to a metal anode electrode.

The number and locations of p+ type regions 20 in the p-well 14, which determine the extent of the shorting of the n+ type region 18 to the p-well 14, affect the characteristics of the device and may be adjusted to achieve the desired characteristics. The optimal design may be determined by simulation.

Either before or after the implant which forms the shallow n+ type region 18, trenches are etched in the p-well 14. In one embodiment, the trenches can be, for example, 1-10 microns deep, and as narrow as practical to maximize the effective area of the n+ type region 18, which serves as the emitter for the NPN transistor. The trenches do not extend into the n-type layer 12.

After the trenches are etched, gate oxide 22 is grown on the sidewalls and bottoms of the trenches to, for example, 0.05-0.15 microns thick. Conductive material, such as heavily doped polysilicon, then fills the trenches and is planarized to form the trenched gates 24.

A dielectric mask layer (not shown) is then formed and patterned for the metallization of the surface. Various metal layers are then deposited to form the gate electrode 26, the cathode electrode 28, and the anode electrode 30. The cathode electrode 28 shorts the n+ type region 18 to the p-well 18 via the p+ type regions 20.

The IGTO devices in any of the figures may have the anode and cathode reversed by reversing the polarities of the materials.

The p-well 14 acts as a base for the NPN bipolar transistor formed by the n+ type region 18 (emitter), p-well 14 (base), and n-type layer 12 (collector). When the gates 24 are shorted to the cathode electrode 28, or otherwise biased below a turn-off threshold voltage, the effective base width (W1 in FIG. 1) is wide (or long), resulting in a low beta for the NPN transistor. The p-well 14, the n-type layer 12, and the p+ type anode region 15 form a PNP bipolar transistor. With a forward bias voltage applied to the anode and cathode electrodes 30/28, the product of the betas of the NPN and PNP transistors is less than one, and no current flows due to the reverse biasing of the pn junction between the n-type layer 12 and the p-well 14. The required dopant levels and layer thicknesses to create the desired betas may be determined by simulation.

When the gate voltage is sufficiently positive relative to the cathode voltage (e.g., 2-5 volts), electrons injected by the n+ type region 18 accumulate around the gates 24. This effectively extends the n+ region toward the right edge of the p-well 14 and thus reduces the base width of the NPN transistor to W2. The reduced base width increases the beta of the NPN transistor so that the product of the betas of the NPN and PNP transistors exceeds one. The initially small diffusion current gets rapidly amplified by feedback until the lateral current through the p-well 14 causes a voltage differential exceeding 0.6 volts across the NPN transistor's emitter-base junction to turn on the NPN transistor. Holes from the p+ type anode region 15 and electrons from the n+ type region 18 are increasingly injected into the p-well 14 and n-type layer 12 until both the NPN and PNP transistors are fully conducting to conduct current between the anode electrode 30 and the cathode electrode 28 with a voltage drop around 1.4 volts. The condition where such conduction happens is called breakover.

When the gates 24 are again shorted to the cathode electrode 28, or otherwise reduced below a turn-off threshold, the NPN transistor base width again becomes wide (W1), and the product of the betas (now below one) can no longer sustain the current conduction. The device thus turns off. The threshold beta of the NPN transistor needed to turn on the IGTO device may be higher than the threshold beta of the NPN transistor needed to turn off the IGTO device, although they may be the same in certain embodiments.

The dopant levels and area dimensions are controlled to avoid latch-up at the operating current to allow the device to be turned on and off via the gate. This is different from a conventional thyristor operation where latch-up is used during normal operation and gate turn-off is not possible.

Since the lateral feature dimensions are precisely controllable using masks, the base width dimensions are precisely controlled. Therefore, the turn-on voltage can be more repeatable from lot to lot compared to the turn on voltage of a vertical IGTO device, previously described. The trench depths of the lateral IGTO device can also be much shallower than those of the vertical IGTO device since the lateral dimensions, rather than the vertical dimensions, determine the breakdown voltage. Further, since the metallization is on top of the structure, it is much easier to electrically isolate the IGTO device and incorporate other circuits in the die, such as sensing and control circuits.

The turn-on voltage of the IGTO device is dependent on various factors, and there is some ramp up time for the current feedback to cause the NPN and PNP transistors to fully turn on. The hybrid IGTO/IGBT structures of FIGS. 4-15 incorporate an insulated gate bipolar transistor (IGBT) in the device, which has a more controllable gate turn-on voltage. The gates of the IGTO and IGBT may be tied together. When the IGBT turns on, some current flows, which accelerates the turn-on of the IGTO portion. An IGTO device is more efficient and has a greater current density than an IGBT, so the IGBT portion should only be a small part of the hybrid device.

Figure 4:
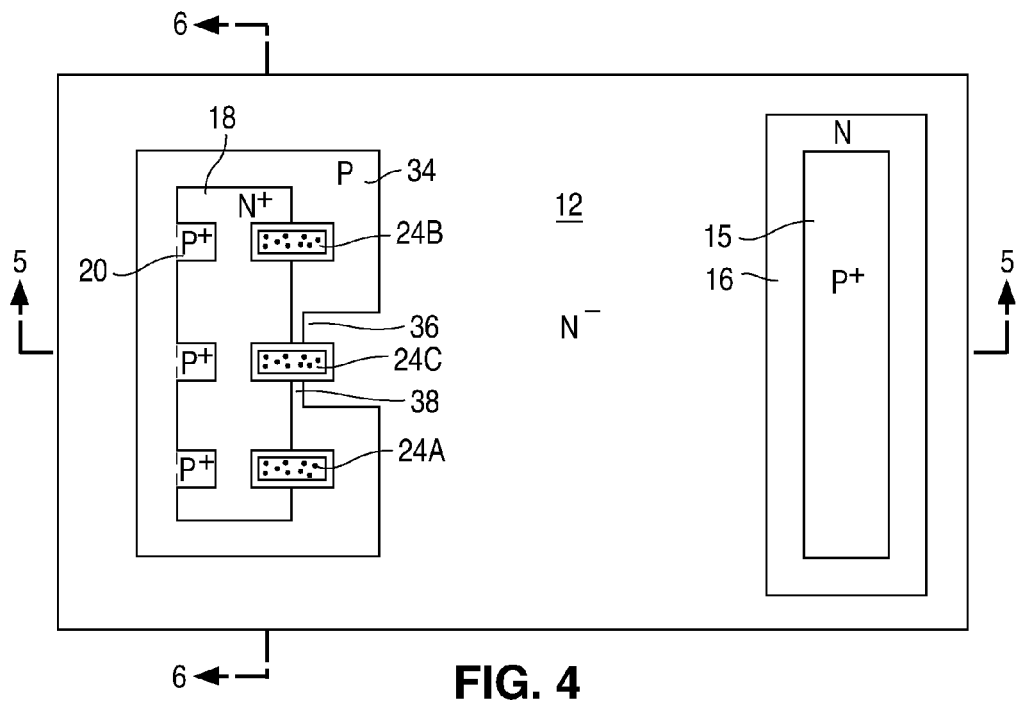
FIG. 4 is a top down view of an IGTO device including an IGBT formed using a notched p-well in accordance with one embodiment of the present invention.
Figure 5:
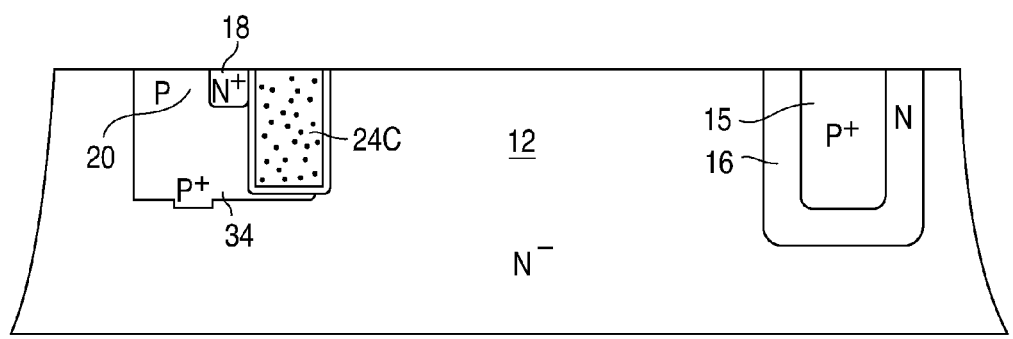
FIG. 5 is a cross-sectional view along line 5-5 in FIG. 4.
Figure 6:
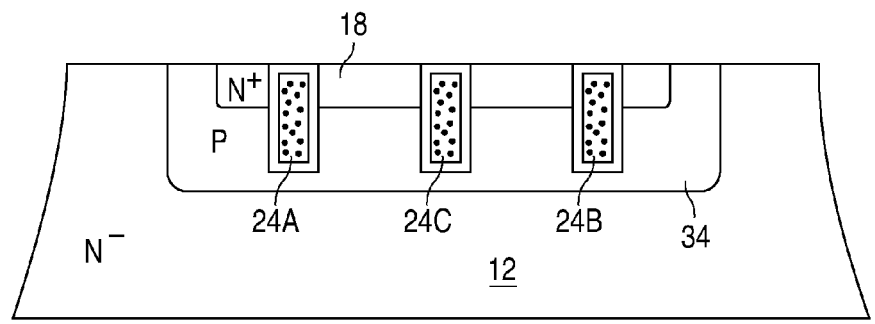
FIG. 6 is a cross-sectional view along line 6-6 in FIG. 4.

In FIG. 4, the mask for the p-well 34 implant is designed to form a notch 36 in the p-well 34. All other masks are the same. FIG. 5 is a cross-sectional view along line 5-5 in FIG. 4, and FIG. 6 is a cross-sectional view along line 6-6 in FIG. 4.

The gates 24A and 24B are identical to the gates 24 in FIG. 1 and have the same function, which is to turn on and off the IGTO device. The gate 24C laterally extends into the n-type layer 12 and is part of an IGBT. The gates 24A, 24B, and 24C may all be connected to the same gate electrode. When the anode and cathode electrodes are forward biased, and a sufficient positive gate bias is applied, the gate 24C inverts the narrow channel 38 on both sides of the gate 24C and current flows between the n+ type region 18 and the p+ type anode region 15. The injection of carriers and current flow accelerates the turn-on of the IGTO device, where both the NPN and PNP transistors turn on. When the IGTO device turns on, a much greater current flows. Accordingly, the turn-on voltage for the hybrid device is better defined, and the device turns on faster.

If a gradual turn-on is desired, such as to limit in-rush currents, the gate 24C may be tied to a separate gate electrode. The gate 24C voltage is then ramped up so the conductivity of the IGBT can be smoothly increased until the IGTO device turns on. The size of the IGBT may be adjusted for controlling the maximum current conducted by the IGBT.

Figure 7:
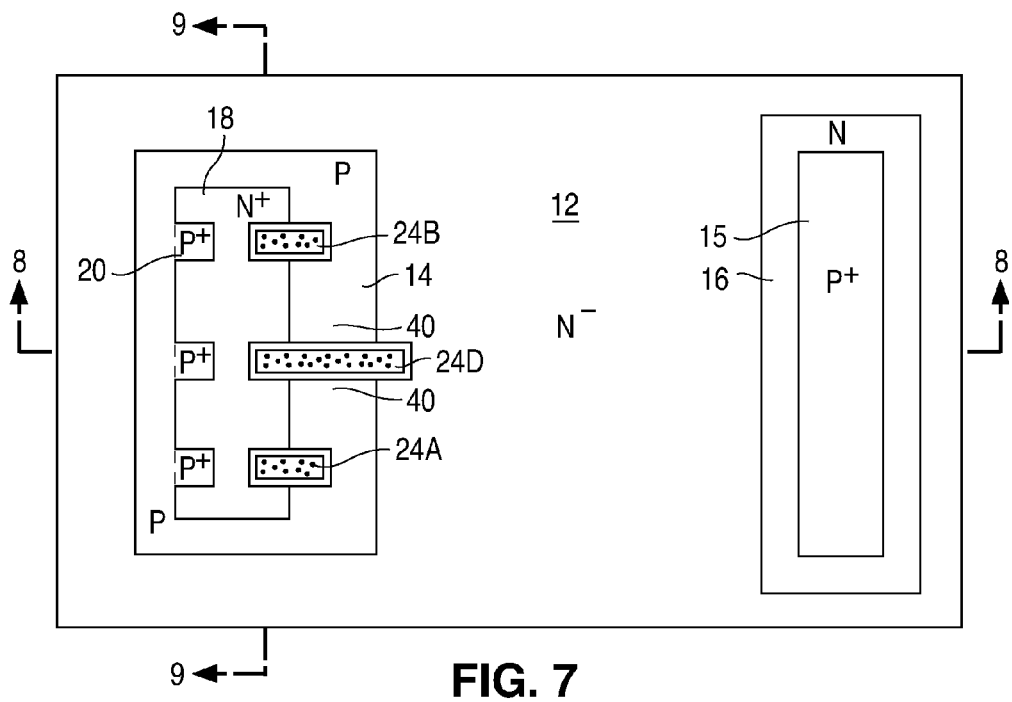
FIG. 7 is a top down view of an IGTO device including an IGBT formed using an elongated trenched gate in accordance with one embodiment of the present invention.
Figure 8:
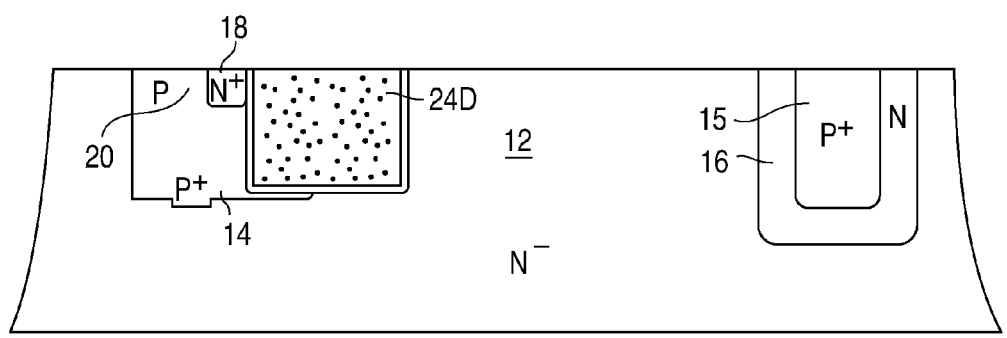
FIG. 8 is a cross-sectional view along line 8-8 in FIG. 7.
Figure 9:
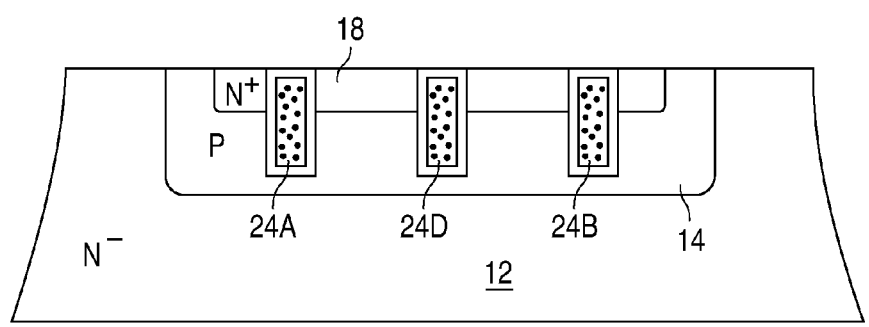
FIG. 9 is a cross-sectional view along line 9-9 in FIG. 7.

In the hybrid IGTO/IGBT device of FIG. 7, the trench mask is designed to form a longer gate 24D that extends laterally through the p-well 14 and into the n-type layer 12. All other masks are the same. FIG. 8 is a cross-sectional view along line 8-8 in FIG. 7, and FIG. 9 is a cross-sectional view along line 9-9 in FIG. 7. As in the embodiment of FIG. 4, when a sufficient positive gate bias is applied, the gate 24D inverts the channel 40 on both sides of the gate 24D, and current flows between the n+ type region 18 and the p+ type anode region 15. The turn-on effects are the same as described with respect to FIG. 4.

Figure 10:
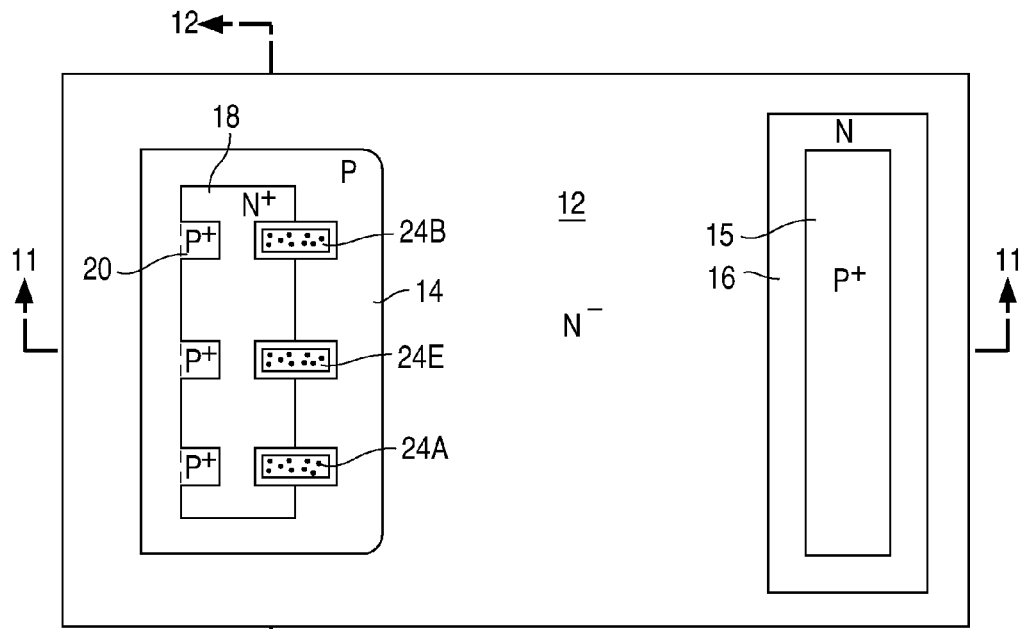
FIG. 10 is a top down view of an IGTO device including an IGBT formed using a deep trenched gate that extends vertically through the p-well in accordance with one embodiment of the present invention.
Figure 11:
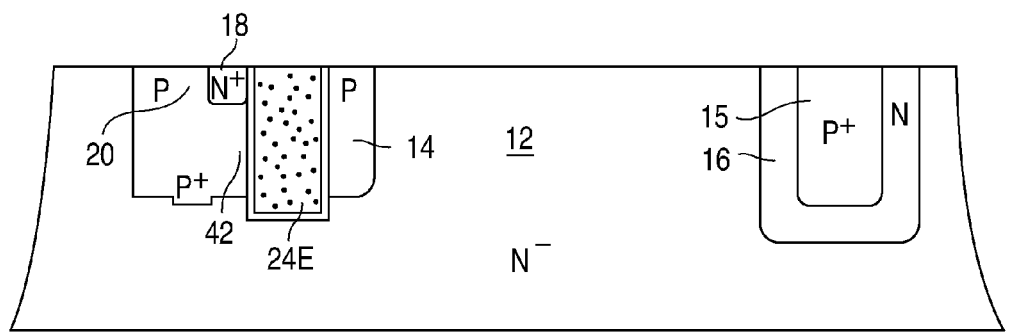
FIG. 11 is a cross-sectional view along line 11-11 in FIG. 10.
Figure 12:
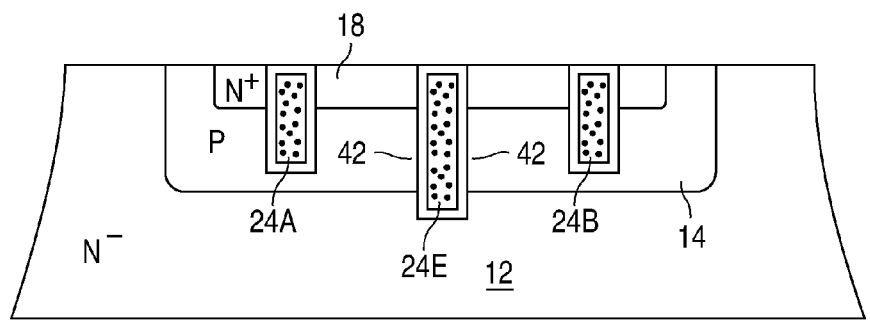
FIG. 12 is a cross-sectional view along line 12-12 in FIG. 10.

In the hybrid IGTO/IGBT device of FIG. 10, an extra trench mask and etching step is used to form the gate 24E to vertically extend through the p-well 14 and into the n-type layer 12. All other masks are the same. FIG. 11 is a cross-sectional view along line 11-11 in FIG. 10, and FIG. 12 is a cross-sectional view along line 12-12 in FIG. 10. When a sufficient positive gate bias is applied, the gate 24E inverts the vertical channel 42 on both sides of the gate 24E, and current flows between the n+ type region 18 and the p+ type anode region 15. The turn-on effects are the same as described with respect to FIG. 4.

Figure 13:
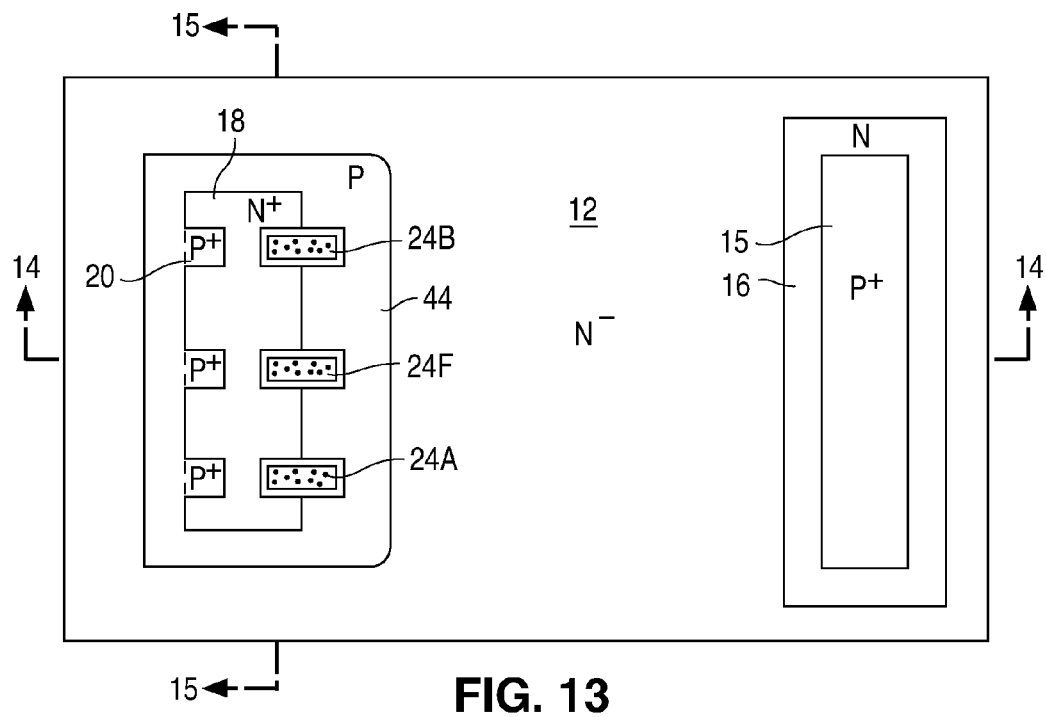
FIG. 13 is a top down view of an IGTO device including an IGBT formed using a shallow-depth portion of the p-well, where a trenched gate extends vertically through the shallow-depth portion of the p-well in accordance with one embodiment of the present invention.
Figure 14:
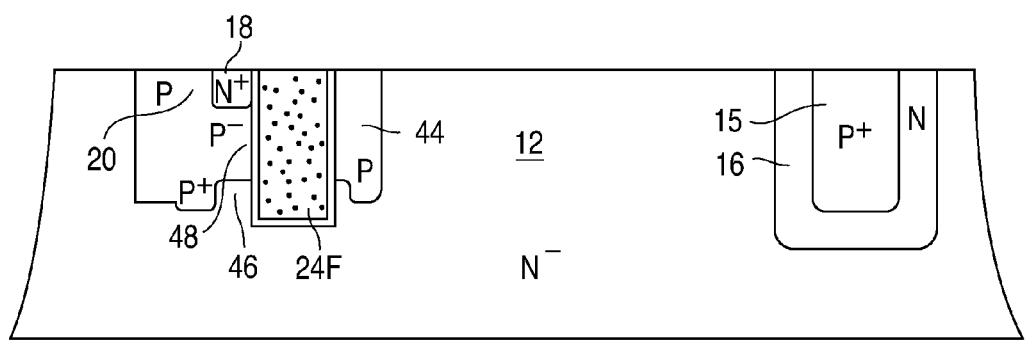
FIG. 14 is a cross-sectional view along line 14-14 in FIG. 13.
Figure 15:
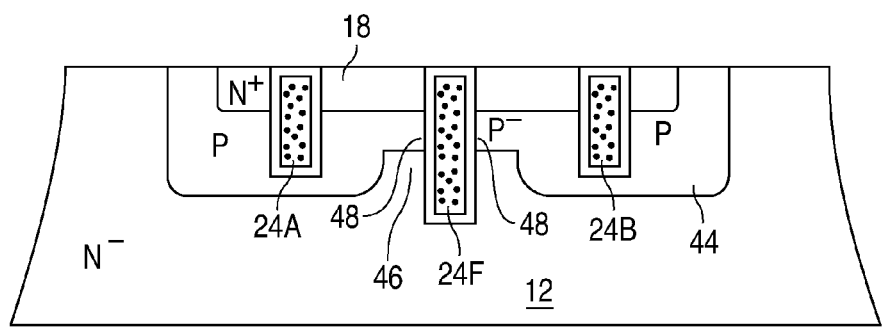
FIG. 15 is a cross-sectional view along line 15-15 in FIG. 13.

In the hybrid IGTO/IGBT device of FIG. 13, an extra p-well 44 mask and doping step is used to form the p-well 44 having a shallower portion 46. FIG. 14 is a cross-sectional view along line 14-14 in FIG. 13, and FIG. 15 is a cross-sectional view along line 15-15 in FIG. 13. The operation of the gates 24A and 24B are the same as the gates 24 in FIG. 1. The gate 24F vertically extends into the n-type layer 12 through the shallower portion 46. All other masks are the same. When a sufficient positive gate bias is applied, the gate 24F inverts the vertical channel 48 on both sides of the gate 24F, and current flows between the n+ type region 18 and the p+ type anode region 15. The turn-on effects are the same as described with respect to FIG. 4.

Figure 16:
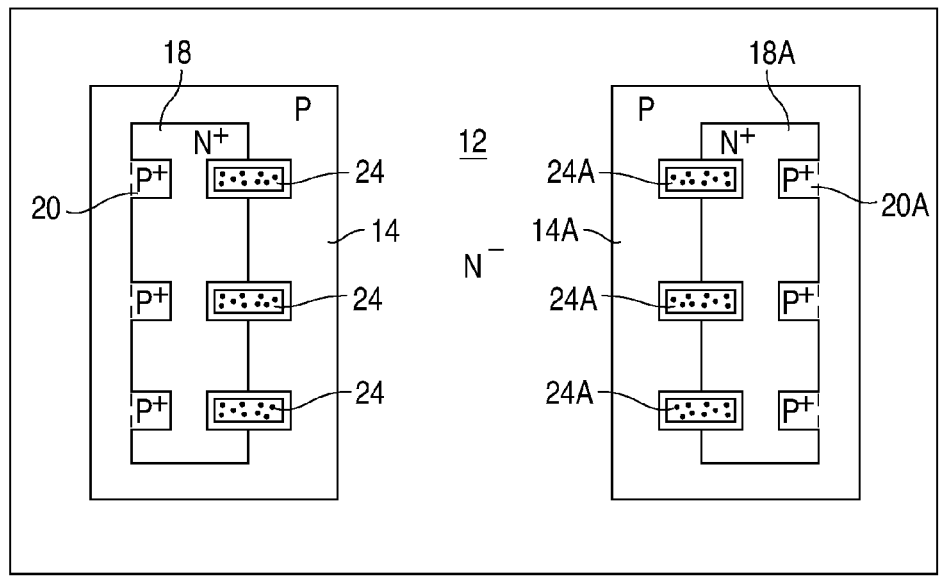
FIG. 16 is a top down view of a bi-directional IGTO device in accordance with one embodiment of the present invention.

FIG. 16 illustrates a bi-directional lateral IGTO device, where a mirror image of the p-well 14, n+ type region 18, p+ type regions 20, and gates 24 is formed instead of the p+ type anode region 15 (FIG. 1) and n-type buffer well 16. The mirror image elements are labeled p-well 14A, n+ type region 18A, p+ type regions 20A, and gates 24A. The electrodes (not shown) are similar to the electrode 28 in FIG. 1. Since the device is bi-directional, either electrode can be a cathode or anode. The gates 24 and 24A are controlled oppositely. The device can be made a hybrid IGTO/IGBT device by using the IGBT structures of FIGS. 4-15.

Figure 17:
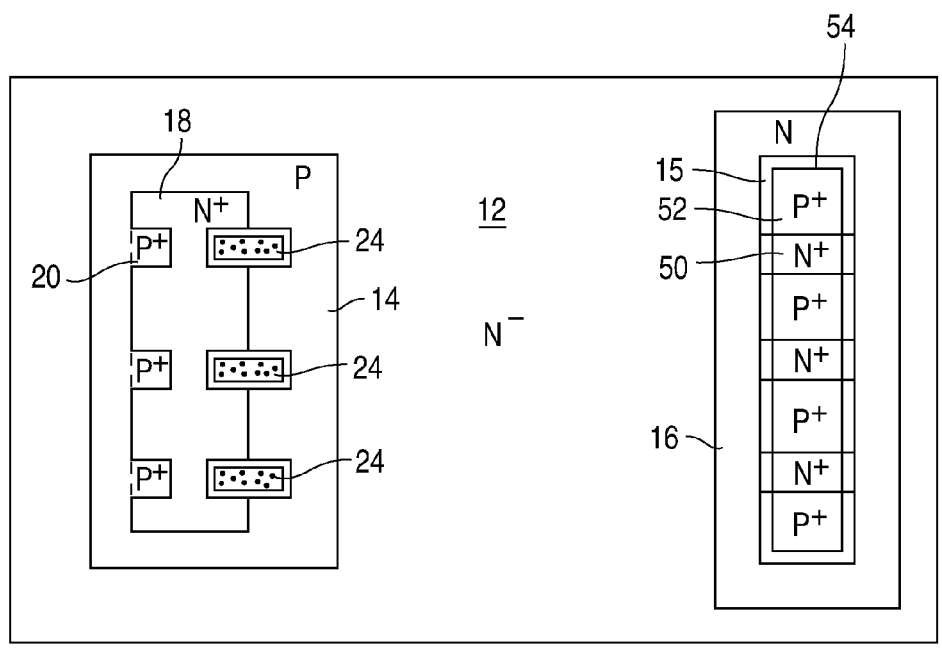
FIG. 17 is a top down view of an IGTO device including a bypass diode in accordance with one embodiment of the present invention.

In the unidirectional devices of FIGS. 1-15, a reverse voltage on the cathode and anode electrodes may damage the device if the reverse voltage is high enough. FIG. 17 illustrates the incorporation of a bypass diode into the device that conducts when the reverse voltage exceeds about 0.6 volts. Therefore, the maximum reverse voltage across the IGTO device is slightly greater than 0.6 volts. The bypass diode is formed by implanting n+ type regions 50 into the p+ type anode region 15 to create alternating p+ type and n+ type regions 50 and 52. The n+ type regions 50 are in contact with the n-type buffer well 16 or the n-type layer 12. The metal anode electrode 30 (FIG. 1) contacts the p+ type and n+ type regions 50 and 52 in the contact area 54. If a reverse voltage over 0.6 volts is applied between the anode and cathode electrodes, the pn diode formed by the n+ type regions 50, the n-type layer 12, the p-well 14, and the p+ type regions 20 conducts current, limiting the voltage across the anode and cathode electrodes to slightly higher than 0.6 volts. This bypass diode may be used in any of the unidirectional embodiments of FIGS. 1-15.

The various embodiments are simplified examples, and high voltage devices will employ features with rounded edges to avoid field crowding. The required voltages and currents will determine the sizes of the devices. The devices may be formed with an array of identical cells or strips that are connected in parallel. Circular or semicircular geometries with the n+ source/emitter and the p+ anode in the center may also be used.

Any features described may be combined together. Conductivities of the various doped regions may be opposite.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lateral insulated gate turn-off (IGTO) device formed as a die comprising:
    a first semiconductor layer of a first conductivity type;
    a well of a second conductivity type formed in the first semiconductor layer;
    a first region of the first conductivity type formed in the well and shallower than the well;
    a second region of the second conductivity type formed in the well and shallower than the well, the second region having a dopant concentration higher than a dopant concentration of the well;
    a first electrode shorting the first region to the second region;
    at least one trenched first gate extending through the first region and into the well, the first gate not extending outside of the well;
    a third region of the second conductivity type formed in the first semiconductor layer and laterally spaced from the well; and
    a second electrode electrically contacting the third region;
    wherein a lateral structure of NPN and PNP transistors is formed, and wherein the well forms a first base of one of the transistors;
    the well having dimensions and a dopant concentration such that, when a forward biasing voltage is applied between the first electrode and the second electrode and when a turn-on voltage is applied to the first gate, the first gate creates an inversion layer in the well to cause the first base to have a reduced width, resulting in the beta of the one of the transistors to increase beyond a first threshold to turn on the IGTO device to conduct a lateral current between the first electrode and the second electrode,
    wherein, when a turn-off voltage is applied to the first gate, the first base has an increased width to cause the beta of the one of the transistors to be reduced below a second threshold to turn off the IGTO device.

2. The device of claim 1 wherein the first semiconductor layer comprises a substrate.

3. The device of claim 1 wherein the first semiconductor layer comprises a layer grown on a substrate.

4. The device of claim 1 wherein the first semiconductor layer comprises a well of the first conductivity type.

5. The device of claim 1 wherein the first gates are formed through a first edge of the first region, and the second region is formed along an opposite edge of the first region.

6. The device of claim 1 wherein the first conductivity type is an n-type and the second conductivity type is a p-type.

7. The device of claim 1 further comprising at least one trenched second gate (24C, 24D, 24E, 24F) that extends beyond the well, wherein, when a turn-on voltage is applied to the second gate, and inversion layer is formed in a channel region between the first region and the first semiconductor layer to cause a current to be conducted between the first electrode and the second electrode, the second gate being part of an insulated gate bipolar transistor (IGBT) portion of the device.

8. The device of claim 7 where there are at least twice as many first gates as second gates.

9. The device of claim 7 wherein the second gate (24C, 24D) extends laterally through the well toward the third region.

10. The device of claim 9 wherein the well has a narrowed area (36) where the second gate (24C) extends laterally through the well toward the third region.

11. The device of claim 7 wherein the second gate (24E, 24F) extends vertically through the well.

12. The device of claim 11 wherein the well has a shallow area 46 where the second gate (24F) extends vertically through the well.

13. The device of claim 1 further comprising a bypass diode, the bypass diode comprising a fourth region (50) of the first conductivity type abutting the third region (15), wherein the second electrode electrically contacts both the fourth region and the third region.

14. The device of claim 1 wherein the device conducts current bi-directionally, the device having a substantially mirror image of the well, the first region, the second region, the first gate, and the third region laterally spaced away from the well.

15. The device of claim 1 wherein the first threshold beta approximately equals the second threshold beta.

16. A method of controlling a lateral insulated gate turn-off (IGTO) device formed as a die, the lateral IGTO device comprising a first semiconductor layer (12) of a first conductivity type, a well (14) of a second conductivity type formed in the first semiconductor layer, a first region (18) of the first conductivity type formed in the well and shallower than the well, a second region (20) of the second conductivity type formed in the well and shallower than the well, the second region having a dopant concentration higher than a dopant concentration of the well, a first electrode (28) shorting the first region to the second region, at least one trenched first gate (24) extending through the first region and into the well, the first gate not extending outside of the well, a third region (15) of the second conductivity type formed in the first semiconductor layer and laterally spaced from the well, and a second electrode (30) electrically contacting the third region, wherein a lateral structure of NPN and PNP transistors is formed, and wherein the well forms a first base of one of the transistors, the method comprising:
  applying a forward biasing voltage between the first electrode and the second electrode;
  applying a turn-on voltage to the first gate, causing the first gate to create an inversion layer in the well to cause the first base to have a reduced width, resulting in the beta of the one of the transistors to increase beyond a first threshold to turn on the IGTO device to conduct a lateral current between the first electrode and the second electrode; and
  applying a turn-off voltage to the first gate, causing the first base to have an increased width to cause the beta of the one of the transistors to be reduced below a second threshold to turn off the IGTO device.

17. The method of claim 16 wherein applying the turn-on voltage to the first gate increases a beta of one of the NPN and PNP transistors.

18. The method of claim 16 wherein the device further comprises at least one trenched second gate (24C, 24D, 24E, 24F) that extends beyond the well, the method further comprising:
  when applying the turn-on voltage to the first gate, also applying the turn-on voltage to the second gate, causing the second gate to create an inversion layer in a channel region between the first region and the first semiconductor layer to cause a current to be conducted between the first electrode and the second electrode, the second gate being part of an insulated gate bipolar transistor (IGBT) portion of the device.

19. The method of claim 18 wherein the second gate (24C, 24D) extends laterally through the well toward the third region.

20. The method of claim 18 wherein the second gate (24E, 24F) extends vertically through the well.

* * * * *